(12) United States Patent
Chen et al.

(10) Patent No.: US 8,288,663 B2
(45) Date of Patent: Oct. 16, 2012

(54) ELECTRICAL INTERCONNECT STRUCTURE AND PROCESS THEREOF AND CIRCUIT BOARD STRUCTURE

(75) Inventors: Tsung-Yuan Chen, Taoyuan County (TW); Shu-Sheng Chiang, Taipei (TW); David C. H. Cheng, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 492 days.

(21) Appl. No.: 12/345,364

(22) Filed: Dec. 29, 2008

(65) Prior Publication Data

US 2009/0282674 A1 Nov. 19, 2009

(30) Foreign Application Priority Data

May 13, 2008 (TW) .............................. 97117559 A (51) Int. Cl.
*H01K 1/11* (2006.01)
(52) U.S. Cl. ........................................ 174/262; 361/792
(58) Field of Classification Search .................. 174/255, 174/260, 261, 262, 266; 361/792–795
See application file for complete search history.

(56) References Cited

U.S. PATENT DOCUMENTS

| | | | | | |
|---|---|---|---|---|---|
| 3,324,014 | A | * | 6/1967 | Modjeska | 205/122 |
| 3,870,776 | A | * | 3/1975 | McMahon | 419/19 |
| 5,369,881 | A | | 12/1994 | Inaba et al. | |
| 5,426,850 | A | * | 6/1995 | Fukutomi et al. | 29/848 |
| 5,504,992 | A | | 4/1996 | Fukutomi et al. | 29/847 |
| 5,517,758 | A | * | 5/1996 | Nakamura | 29/852 |
| 5,690,837 | A | * | 11/1997 | Nakaso et al. | 216/17 |
| 6,207,259 | B1 | | 3/2001 | Iino et al. | |
| 6,748,652 | B2 | * | 6/2004 | Andou et al. | 29/852 |
| 7,279,108 | B2 | * | 10/2007 | Kukanskis et al. | 216/13 |
| 7,501,582 | B2 | * | 3/2009 | McDermott et al. | 174/255 |
| 7,629,045 | B2 | * | 12/2009 | Takai et al. | 428/344 |
| 7,651,021 | B2 | * | 1/2010 | Supriya et al. | 228/180.22 |
| 7,774,932 | B2 | * | 8/2010 | Chen et al. | 29/852 |
| 7,794,820 | B2 | * | 9/2010 | Kim et al. | 428/209 |
| 7,836,590 | B2 | * | 11/2010 | Mok et al. | 29/852 |
| 2002/0066672 | A1 | | 6/2002 | Iijima et al. | |
| 2008/0092376 | A1 | | 4/2008 | Magera et al. | |

FOREIGN PATENT DOCUMENTS

| | | |
|---|---|---|
| JP | 06-140742 | 5/1994 |
| JP | 2004-253432 | 9/2004 |
| JP | 2008-529283 | 7/2008 |

OTHER PUBLICATIONS

Chinese First Examination Report of China Application No. 200810128857.6, dated Jul. 30, 2010.
"The European Search Report of corresponding EP application", issued on Jun. 4, 2009, p. 1-p. 6.
Japanese Examination Report of Japan Application No. 2009-033666, dated Apr. 19, 2011.

\* cited by examiner

*Primary Examiner* — Thanh Tam Le
(74) *Attorney, Agent, or Firm* — J.C. Patents (57) ABSTRACT

An electrical interconnecting structure suitable for a circuit board is provided. The electrical interconnecting structure includes a core, an ultra fine pattern, and a patterned conductive layer. The core has a surface, and the ultra fine pattern is inlaid in the surface of the core. The patterned conductive layer is disposed on the surface of the core and is partially connected to the ultra fine pattern. Since the ultra fine pattern of the electrical interconnecting structure is inlaid in the surface of the core and is partially connected to the patterned conductive layer located on the surface of the core.

15 Claims, 12 Drawing Sheets

ELECTRICAL INTERCONNECT STRUCTURE AND PROCESS THEREOF AND CIRCUIT BOARD STRUCTURE

CROSS-REFERENCE TO RELATED APPLICATION

This application claims the priority benefit of Taiwan application serial no. 97117559, filed on May 13, 2008. The entirety of the above-mentioned patent application is hereby incorporated by reference herein and made a part of specification.

BACKGROUND OF THE INVENTION

1. Field of the Invention

The present invention is related to an electrical interconnecting structure. More particularly, the present invention is related to an electrical interconnecting structure applied to a circuit board and a fabricating process thereof.

2. Description of Related Art

A conventional circuit board is mainly composed of a plurality of patterned conductive layers and a plurality of dielectric layers alternately stacked to one another. In addition, the patterned conductive layers are electrically connected through a plurality of conductive vias. On the other hand, the circuit board can be further categorized by processes for fabricating the same. Generally, the circuit board is fabricated by performing a laminating process or a build-up process. In most cases, the circuit board with a comparatively low layout density is fabricated by performing the laminating process, while the circuit board with a comparatively high layout density is manufactured by performing the build-up process.

Figure 1A:
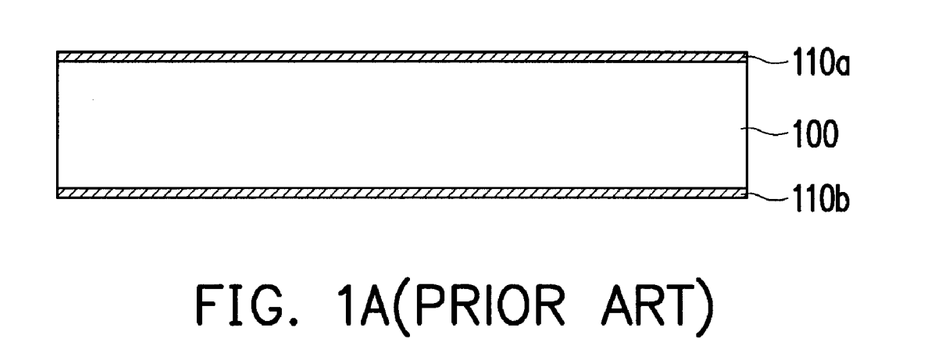
FIGS. 1A through 1G are cross-sectional flowcharts of a process for fabricating a conventional circuit board.

Please refer to FIGS. 1A through 1G which are cross-sectional flowcharts of a process for fabricating a conventional circuit board. As shown in FIG. 1A, non-patterned conductive layers 110a and 110b are respectively disposed on two opposite surfaces of a dielectric layer 100. Here, the dielectric layer 100 can be made of epoxy resin or glass-fiber-containing epoxy resin, while the conductive layers 110a and 110b are made of copper.

Figure 1B:
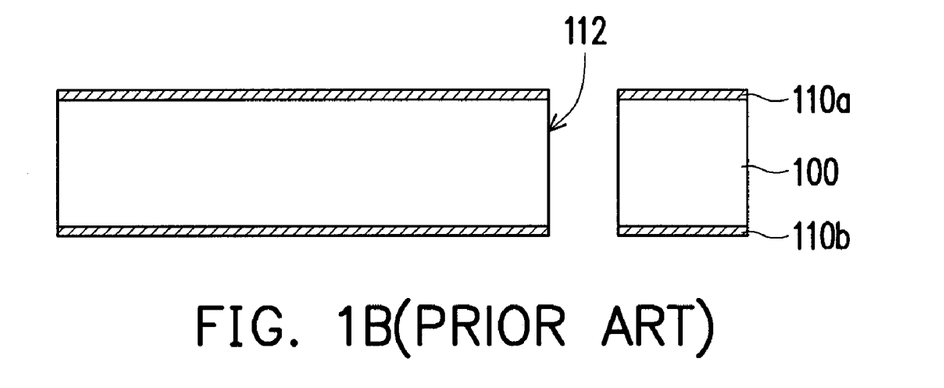

In FIG. 1B, a plurality of through holes 112 (only one is depicted) are then formed in the dielectric layer 100 and the non-patterned conductive layers 110a and 110b. A method of forming the through holes 112 includes mechanical drilling or laser ablating.

Figure 1C:
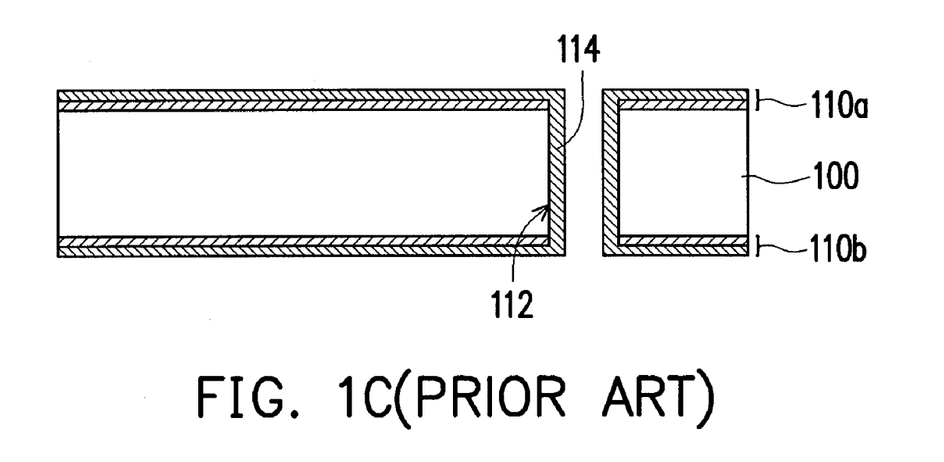

Next, as shown in FIG. 1C, a conductive wall acting as a conductive through via 114 is formed on respective surfaces of the through holes 112 by electroplating. During the formation of the conductive through via 114 by electroplating, an electroplating layer is formed on the surface of the conductive layer 110a, while another electroplating layer is formed on the surface of the conductive layer 110b. Here, the two electroplating layers serve as a part of the conductive layers 110a and 110b, respectively.

Figure 1D:
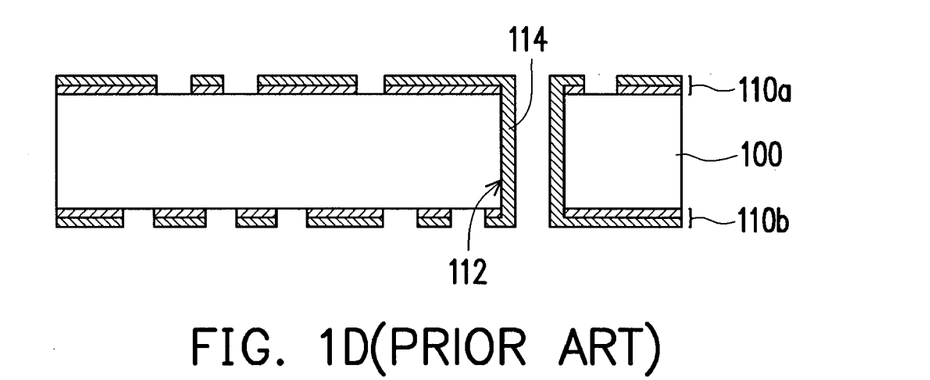

After that, as indicated in FIG. 1D, the non-patterned conductive layers 110a and 110b are patterned by performing photolithography and etching processes, so as to form the patterned conductive layers 110a and 110b.

Figure 1E:
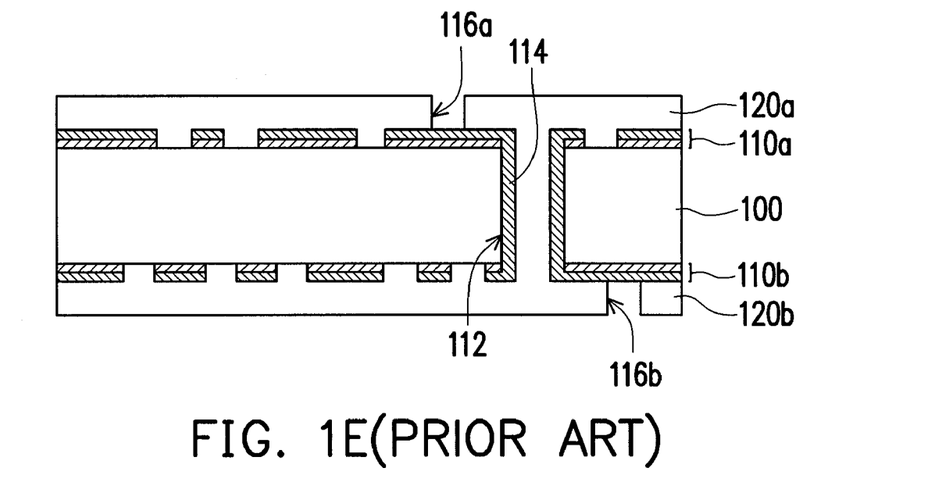

With reference to FIG. 1E, the laminating process or the build-up process is then performed for forming dielectric layers 120a and 120b respectively on the patterned conductive layers 110a and 110b. Openings 116a and 116b are then formed on the dielectric layers 120a and 120b by way of mechanical drilling or laser ablating.

Figure 1F:
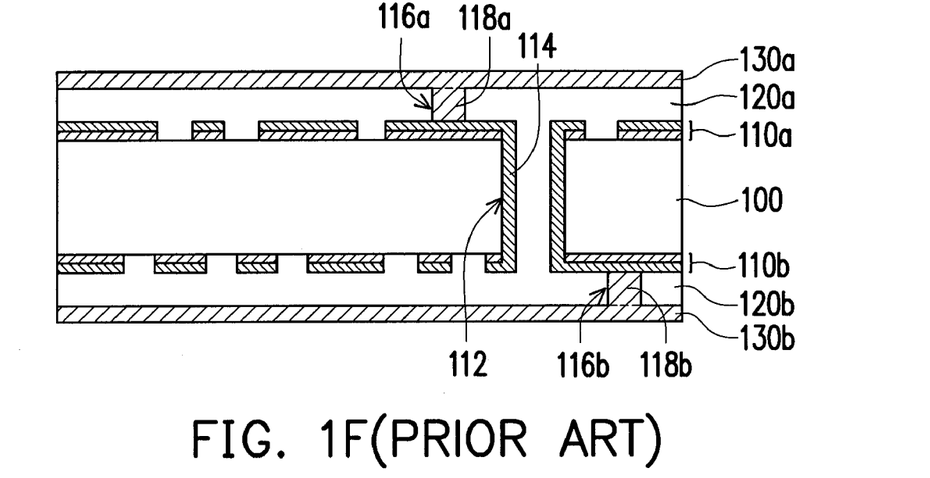

As shown in FIG. 1F, the openings 116a and 116b are then filled with a conductive material by electroplating, such that conductive micro vias 118a and 118b are formed. Meanwhile, conductive layers 130a and 130b are formed on the dielectric layers 120a and 120b. Here, the conductive micro vias 118a and 118b and the non-patterned conductive layers 130a and 130b are formed by electroplating.

Figure 1G:
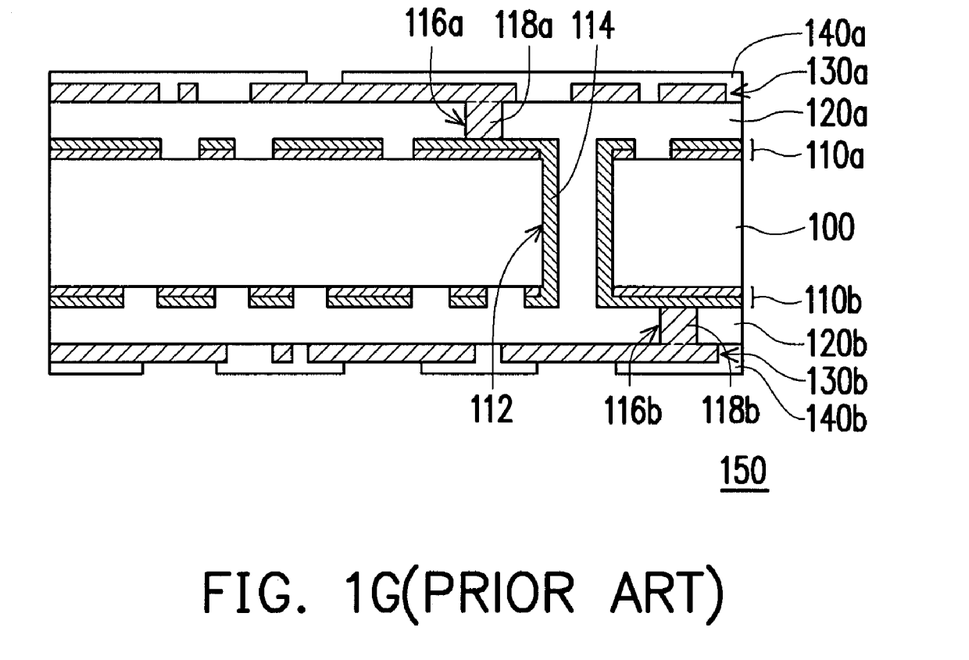

Afterwards, as indicated in FIG. 1G, the conductive layers 130a and 130b are patterned through implementing the photolithography and etching processes. Next, two solder masks 140a and 140b are respectively formed on the patterned conductive layers 130a and 130b, while the patterned conductive layers 130a and 130b are partially exposed by the two solder masks 140a and 140b. As such, a circuit board 150 is completely formed.

It is known from the aforesaid process for manufacturing the conventional circuit board that the circuit board must be formed by alternately stacking a plurality of patterned conductive layers and a plurality of dielectric layers. However, owing to the limitation on the line width and the pitch of ultra fine wires, the layout density of the circuit board is not able to be further enhanced. Therefore, when the circuits are prone to be equipped with high density and great complexity, the layout density of the conductive layers that are formed by performing the photolithography and etching processes is not likely to be improved. As long as the circuit board is meant to provide more signal transmission paths, the disposition of additional patterned conductive layers in the circuit board is required. As a result, the thickness of the circuit board is inevitably increased.

SUMMARY OF THE INVENTION

The present invention is directed to an electrical interconnecting structure suitable for a circuit board with a layout density.

The present invention is further directed to a circuit board structure for providing high layout density.

The present invention is further directed to a process for fabricating an electrical interconnecting structure. The process for fabricating the electrical interconnecting structure is suitable for a process for fabricating a circuit board, such that the circuit board with high layout density can be formed.

In the present invention, an electrical interconnecting structure suitable for a circuit board is provided. The electrical interconnect structure includes a core, an ultra fine pattern, and a patterned conductive layer. The core has a surface, and the ultra fine pattern is inlaid in the surface of the core. The patterned conductive layer is disposed on the surface of the core and is partially connected to the ultra fine pattern.

According to an embodiment of the present invention, the core is a dielectric layer.

According to an embodiment of the present invention, the core includes a dielectric layer constituting the surface of the core.

In the present invention, a circuit board structure including a core, a first ultra fine pattern, a first patterned conductive layer, and a second patterned conductive layer is further provided. The core has a first surface and a second surface corresponding to the first surface, and the first ultra fine pattern is inlaid in the first surface of the core. The first patterned conductive layer is disposed on the first surface of the core and is partially connected to a portion of the first ultra fine pattern. The second patterned conductive layer is disposed on the second surface of the core.

According to an embodiment of the present invention, the circuit board structure further includes at least a first conductive through via that penetrates the core and connects the first patterned conductive layer and the second patterned conductive layer.

According to an embodiment of the present invention, the circuit board structure further includes a second ultra fine pattern inlaid in the second surface of the core. The first ultra fine pattern is partially connected to a portion of the second patterned conductive layer.

According to an embodiment of the present invention, the core is a dielectric layer.

According to an embodiment of the present invention, the core includes at least two dielectric layers and at least a third patterned conductive layer that is interposed between the two dielectric layers of the circuit board structure. The two dielectric layers constitute the first surface and the second surface of the core, respectively.

According to an embodiment of the present invention, the core further includes at least a second conductive through via that penetrates the dielectric layers. Besides, the third patterned conductive layer is electrically connected to at least one of the first patterned conductive layer and the second patterned conductive layer through the second conductive through via.

In the present invention, a process for fabricating an electrical interconnecting structure suitable for a process for fabricating a circuit board is further provided. The process for fabricating the electrical interconnecting structure includes firstly providing a core. After that, based on the required circuit layout, a portion of the core is removed from a first surface of the core, so as to form an ultra fine trench on the first surface of the core. Next, the ultra fine trench is filled with a conductive material, so as to form an ultra fine pattern. After that, a conductive layer is patterned for forming a patterned conductive layer on the first surface of the core, and the patterned conductive layer is partially connected to a portion of the ultra fine pattern.

According to an embodiment of the present invention, a method of removing the portion of the core includes laser ablating.

According to an embodiment of the present invention, a conductive layer to be patterned is simultaneously formed on the first surface of the core during the formation of the ultra fine pattern. Next, the conductive layer is then patterned to form a patterned conductive layer on the first surface of the core by patterning the non-patterned conductive layer.

According to an embodiment of the present invention, a method of forming the ultra fine pattern and the non-patterned conductive layer includes electroplating.

According to an embodiment of the present invention, a method of patterning the conductive layer includes performing a subtractive process.

According to an embodiment of the present invention, a method of patterning the non-patterned conductive layer includes performing photolithography and etching processes.

According to an embodiment of the present invention, a patterned conductive layer is simultaneously formed on the first surface of the core during the formation of the ultra fine pattern.

According to an embodiment of the present invention, a method of forming the ultra fine pattern and the patterned conductive layer includes performing an additive process or a semi-additive process.

According to an embodiment of the present invention, a method of forming the ultra fine pattern and the patterned conductive layer includes performing photolithography and electroplating processes.

According to an embodiment of the present invention, the core is a dielectric layer.

According to an embodiment of the present invention, the core includes at least two dielectric layers and at least a third patterned conductive layer that is interposed between the two dielectric layers. The two dielectric layers constitute the first surface and a second surface of the core, respectively.

According to an embodiment of the present invention, the core further includes at least a conductive through via that penetrates the dielectric layers of the electrical interconnecting structure. Besides, the third patterned conductive layer is electrically connected to at least one of the first patterned conductive layer and the second patterned conductive layer through the second conductive through via.

In light of the foregoing, the ultra fine pattern is inlaid in the surface of the core and is partially connected to the patterned conductive layer located on the surface of the core according to the present invention. As such, an average layout density of the circuit board can be improved through the disposition of the ultra fine pattern.

To make the above and other objectives, features, and advantages of the are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

[First Embodiment]

The first embodiment teaches a circuit board having two conductive layers. Please refer to FIGS. 2A through 2E which are cross-sectional flowcharts of a process for fabricating an electrical interconnecting structure according to the first embodiment of the present invention.

Figure 2A:
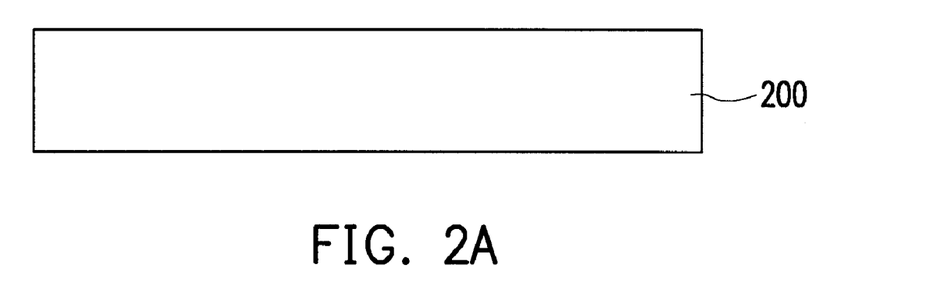
FIGS. 2A through 2E are cross-sectional flowcharts of a process for fabricating an electrical interconnecting structure according to a first embodiment of the present invention.

As shown in FIG. 2A, a plate to be used in the process for fabricating the electrical interconnecting structure can be a double-sided plate in which two conductive layers are respectively disposed on two sides of a single dielectric layer, an one-sided plate in which a conductive layer is disposed on one side of a single dielectric layer, or a single dielectric layer. In the present embodiment, a core 200 is a single dielectric layer made of epoxy resin or glass-fiber-containing epoxy resin.

Figure 2B:
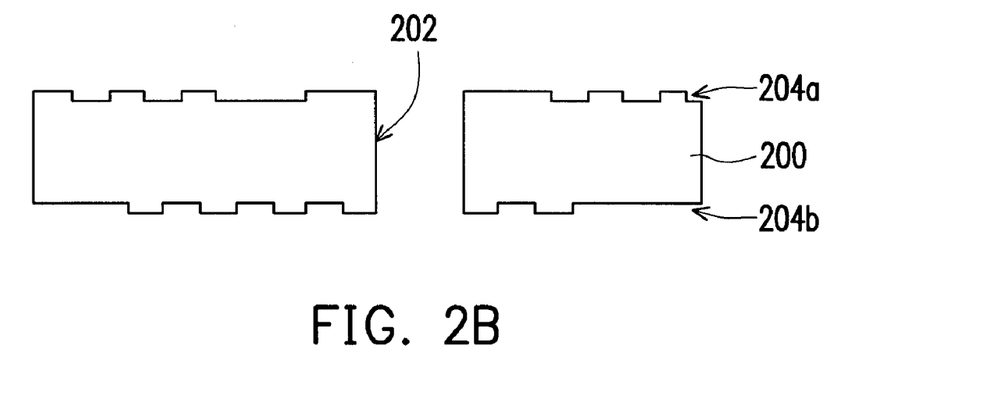

With reference to FIG. 2B, based on the required circuit layout, at least a through hole 202 is formed in the core 200 by way of mechanical drilling or laser ablating, for example. In the meantime, an ultra fine trench 204a and an ultra fine trench 204b can be formed on respective sides of the core 200 by laser ablating and distributed to surfaces of the core 200 according to the circuit layout.

Figure 2C:
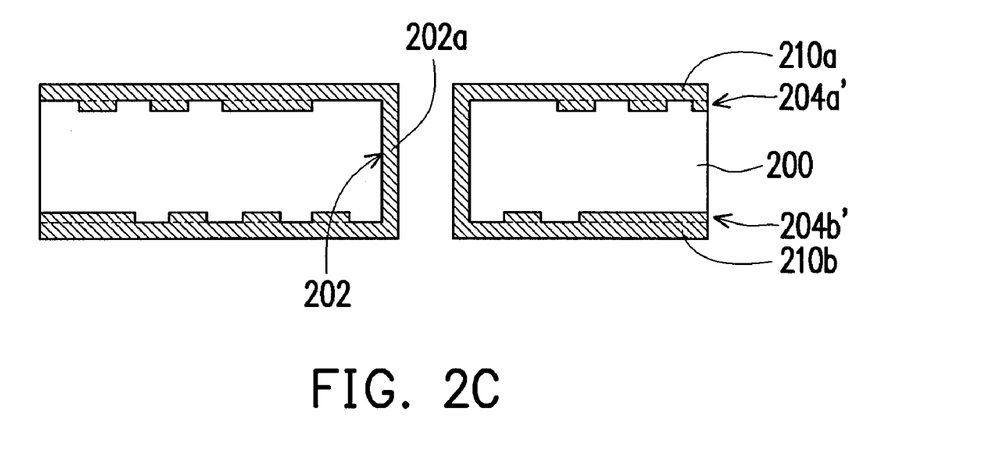

As indicated in FIG. 2C, the ultra fine trenches 204a and 204b are then filled with a conductive material by way of electroplating, so as to form two ultra fine patterns 204a' and 204b'. In addition, two non-patterned conductive layers 210a and 210b can be simultaneously formed on the two sides of the core 200 during the formation of the ultra fine patterns 204a' and 204b', and a conductive wall acting as a conductive through via 202a is also formed inside the through hole 202, so as to electrically connect the two conductive layers 210a and 210b. Here, the conductive material is, for example, copper.

Figure 2D:
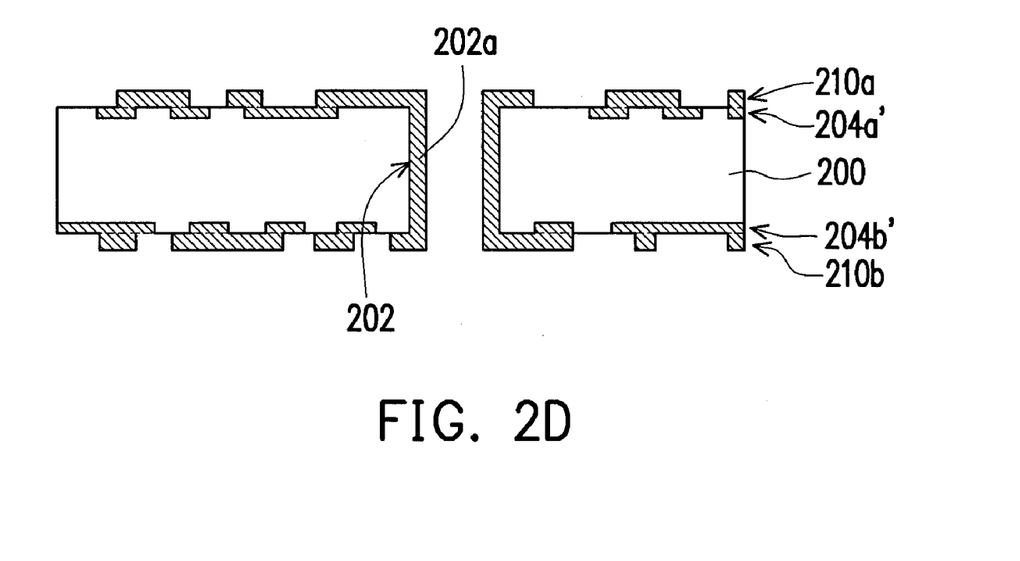

After that, as indicated in FIG. 2D, the non-patterned conductive layers 210a and 210b are patterned by performing photolithography and etching processes, so as to form two patterned conductive layers 210a and 210b that are partially connected to portions of the ultra fine patterns 204a' and 204b'.

Figure 2E:
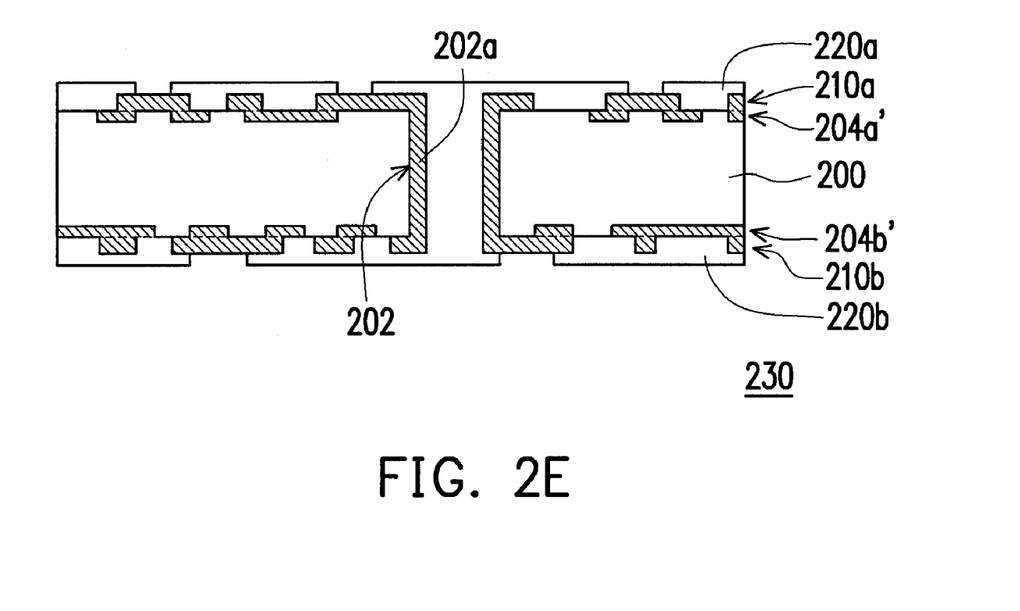

Next, with reference to FIG. 2E, two solder masks 220a and 220b are formed on the patterned conductive layers 210a and 210b, respectively, such that an electrical interconnecting structure 230, i.e. a circuit board structure, is completely formed.

In the first embodiment of the present invention, the circuit board having the two conductive layers and at least one ultra fine pattern inlaid in a surface of the dielectric layer are provided. The line width and the pitch of the ultra fine pattern are smaller than those of a normal patterned conductive layer, and therefore the ultra fine pattern is conducive to an improvement of an average layout density of the circuit board. Additionally, the ultra fine pattern and the patterned conductive layers partially connected to the ultra fine pattern in the present embodiment can be formed by performing not only a subtractive process but also an additive process or a semi-additive process.

[Second Embodiment]

In comparison with the first embodiment in which the circuit board is equipped with two conductive layers, the second embodiment teaches a circuit board having four conductive layers. Please refer to FIGS. 3A through 3I which are cross-sectional flowcharts of a process for fabricating an electrical interconnecting structure according to the second embodiment of the present invention.

Figure 3A:
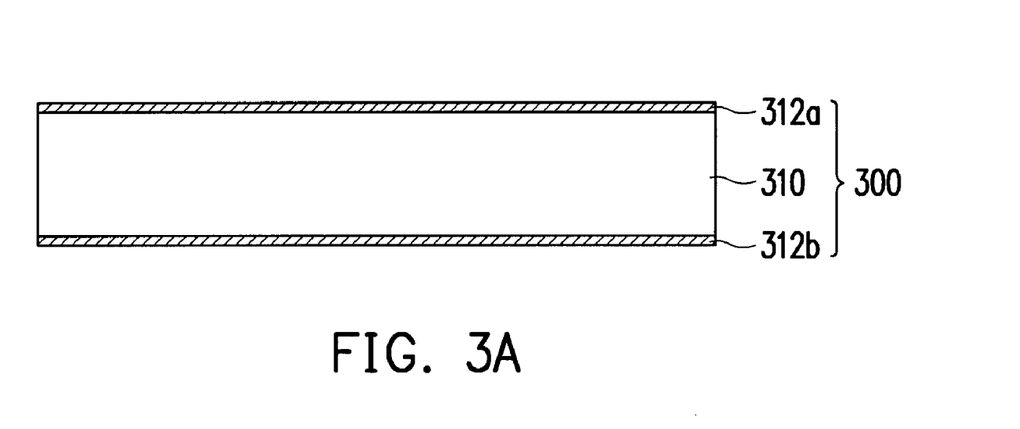
FIGS. 3A through 3I are cross-sectional flowcharts of a process for fabricating an electrical interconnecting structure according to a second embodiment of the present invention.

As shown in FIG. 3A, a plate to be used in the process for fabricating the electrical interconnecting structure can be a double-sided plate in which two conductive layers are respectively disposed on two sides of a single dielectric layer, an one-sided plate in which a conductive layer is disposed on one side of a single dielectric layer, or a single dielectric layer. In the present embodiment, the circuit board acting as a core 300 of the plate to be used in the process for fabricating the electrical interconnecting structure is referred to as the double-sided plate. The core 300 may include a dielectric layer 310 and two conductive layers 312a and 312b to be patterned. Here, the dielectric layer 310 can be made of epoxy resin or glass-fiber-containing epoxy resin. The conductive layers 310a and 310b respectively disposed on two surfaces of the dielectric layer 310 can be made of copper.

Figure 3B:
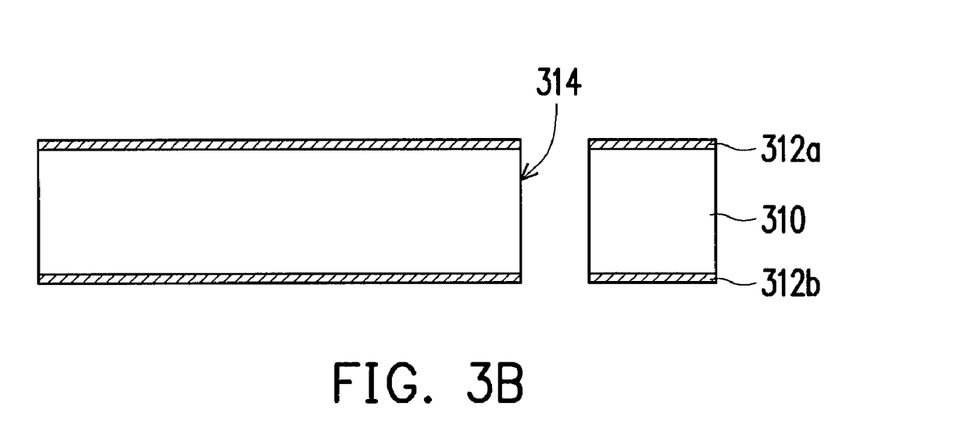

With reference to FIG. 3B, based on the required circuit layout, at least a through hole 314 is formed in the dielectric layer 310 and the conductive layers 312a and 312b by way of mechanical drilling or laser ablating, for example.

Figure 3C:
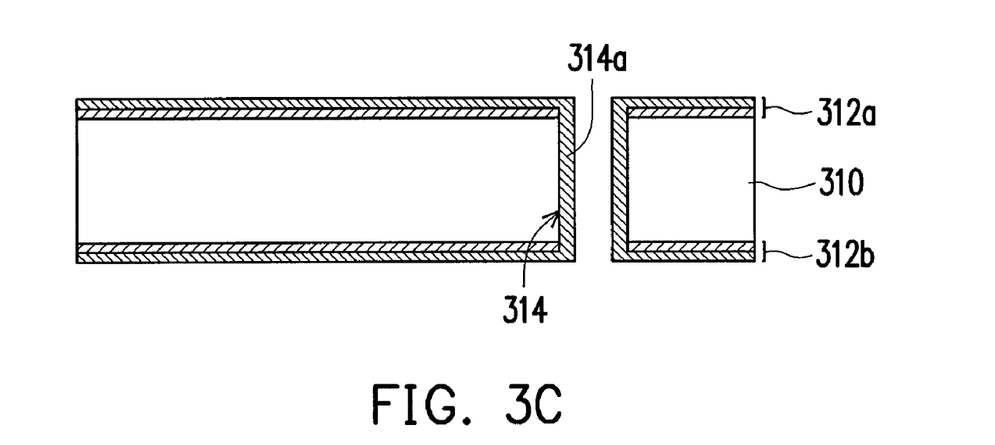

Next, as shown in FIG. 3C, a conductive wall serving as a conductive through via 314a is formed inside the through hole 314 by implementing an electroplating process, for example. In addition, the thickness of the conductive layers 312a and 312b is simultaneously increased during the implementation of the electroplating process.

Figure 3D:
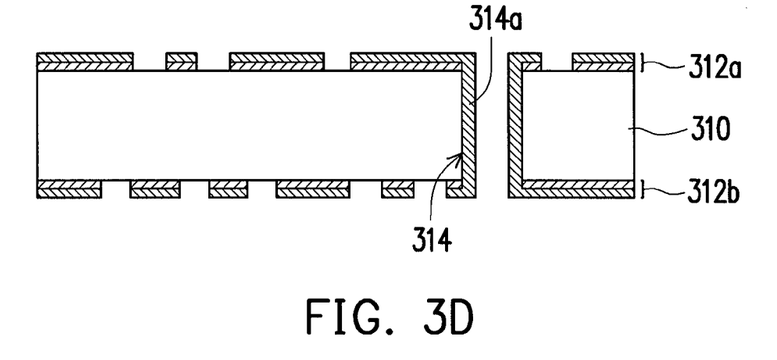

Thereafter, as shown in FIG. 3D, the conductive layers 312a and 312b are patterned through implementing photolithography and etching processes, for example.

Figure 3E:
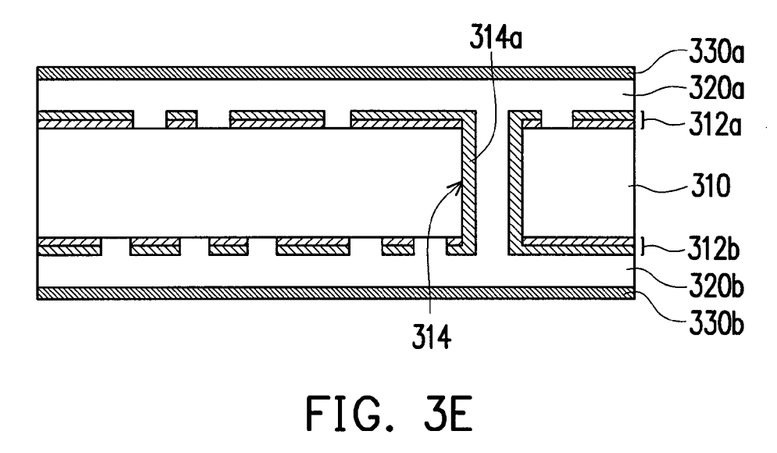

After that, with reference to FIG. 3E, two dielectric layers 320a and 320b are respectively formed on the patterned conductive layers 312a and 312b. Two conductive layers 330a and 330b are then respectively disposed on surfaces of the two dielectric layers 320a and 320b.

Figure 3F:
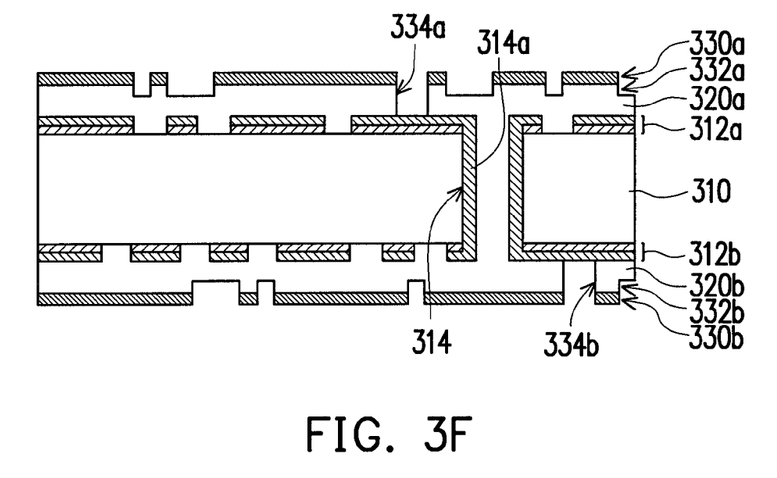

Next, as indicated in FIG. 3F, portions of the conductive layers 330a and 330b are removed by etching or laser ablating, for example, such that the surfaces of the dielectric layers 320a and 320b are exposed. Ultra fine trenches 332a and 332b are subsequently laser-ablated on the dielectric layers 320a and 320b, for example. Note that two openings 334a and 334b can be respectively formed on the dielectric layers 320a and 320b by laser ablating when the ultra fine trenches 332a and 332b are simultaneously formed by laser ablating.

Figure 3G:
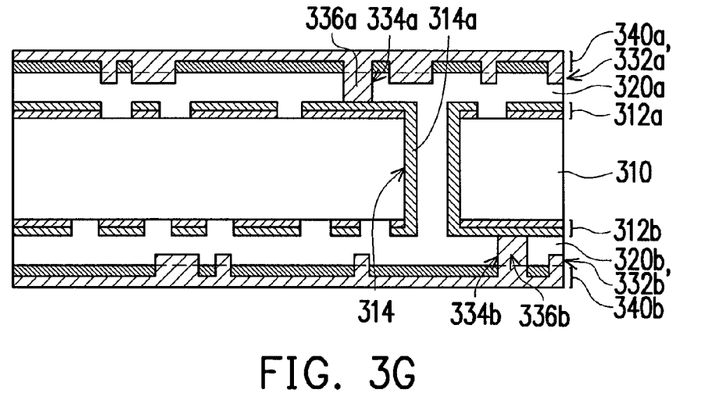

Next, as shown in FIG. 3G, the ultra fine trenches 332a and 332b and the openings 334a and 334b are filled with a conductive material by electroplating, for example, so as to form ultra fine patterns 332a' and 332b' and conductive micro vias 336a and 336b. Meanwhile, two conductive layers are formed on the entire ultra fine patterns 332a' and 332b'. The two conductive layers and the conductive layers 330a and 330b together constitute two non-patterned conductive layers 340a and 340b. Note that the conductive material may include copper.

Figure 3H:
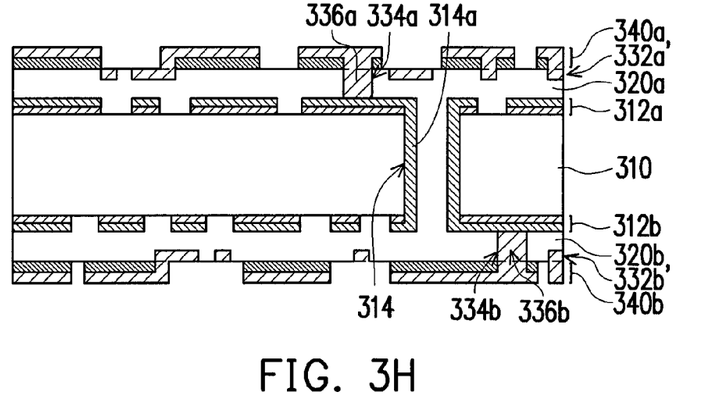

It is shown in FIG. 3H that the non-patterned conductive layers 340a and 340b are then patterned by performing the photolithography and etching processes, for example, and the patterned conductive layers 340a and 340b are partially connected to portions of the ultra fine patterns 332a' and 332b'.

Figure 3I:
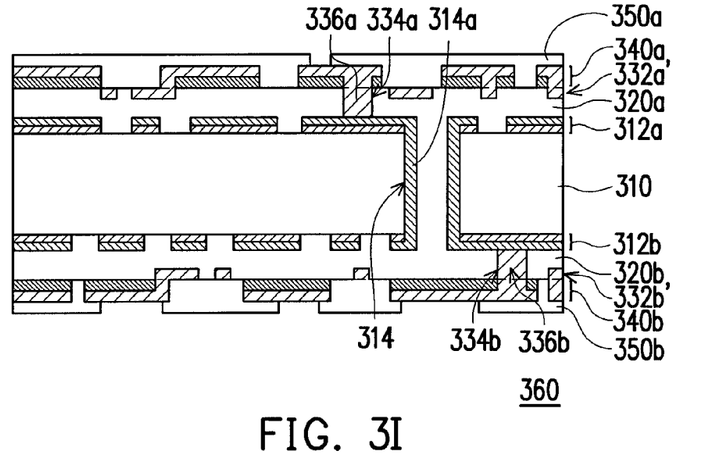

With reference to FIG. 3I, two solder masks 350a and 350b are then formed on the patterned conductive layers 340a and 340b, respectively, such that an electrical interconnecting structure 360, i.e. a circuit board structure, is completely formed.

In the second embodiment of the present invention, the circuit board having the four conductive layers and at least one ultra fine pattern inlaid in the surface of the dielectric layer are provided. The line width and the pitch of the ultra fine pattern are smaller than those of a normal patterned conductive layer, and therefore the ultra fine pattern is conducive to an improvement of an average layout density of the circuit board. Additionally, the ultra fine pattern and the patterned conductive layers partially connected to the ultra fine pattern in the present embodiment can be formed by performing not only a subtractive process but also an additive process or a semi-additive process.

[Third Embodiment]

Please refer to FIGS. 4A through 4J which are cross-sectional flowcharts of a process for fabricating an electrical interconnecting structure according to a third embodiment of the present invention.

Figure 4A:
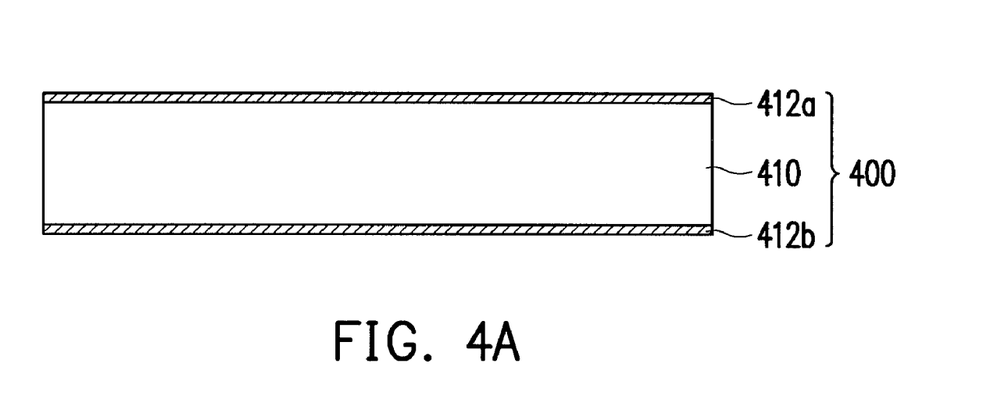
FIGS. 4A through 4J are cross-sectional flowcharts of a process for fabricating an electrical interconnecting structure according to a third embodiment of the present invention.

As shown in FIG. 4A, a plate to be used in the process for fabricating the electrical interconnecting structure can be a double-sided plate in which two conductive layers are respectively disposed on two sides of a single dielectric layer, an one-sided plate in which a conductive layer is disposed on one side of a single dielectric layer, or a single dielectric layer. In the present embodiment, the circuit board acting as a core 400 of the plate to be used in the process for fabricating the electrical interconnecting structure is referred to as the double-sided plate. The core 400 may include a dielectric layer 410 and two conductive layers 412a and 412b to be patterned. Here, the dielectric layer 410 can be made of epoxy resin or glass-fiber-containing epoxy resin. The conductive layers 412a and 412b respectively disposed on two surfaces of the dielectric layer 410 can be made of copper.

Figure 4B:
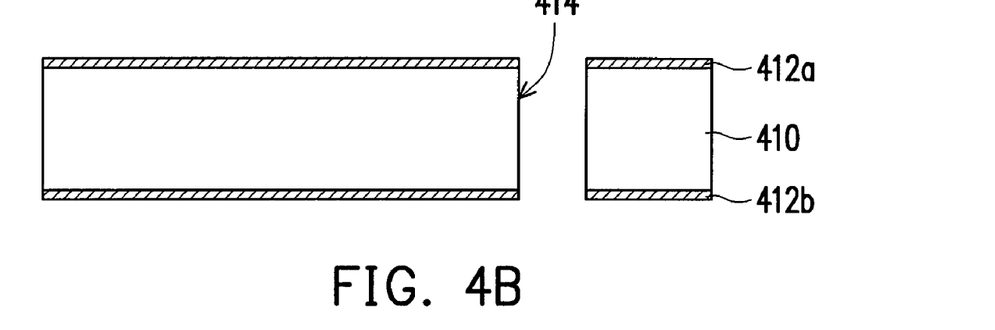

With reference to FIG. 4B, based on the required circuit layout, at least a through hole 414 is formed in the dielectric layer 410 and the conductive layers 412a and 412b by way of mechanical drilling or laser ablating, for example.

Figure 4C:
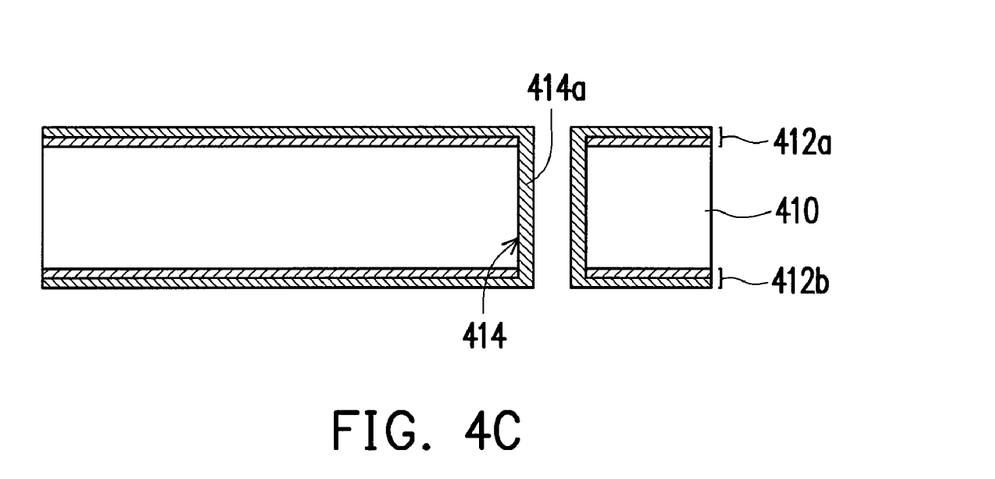

Next, as shown in FIG. 4C, a conductive wall serving as a conductive through via 414a is formed inside the through hole 414 by implementing an electroplating process, for example. In addition, the thickness of the conductive layers 412a and 412b is simultaneously increased during the implementation of the electroplating process.

Figure 4D:
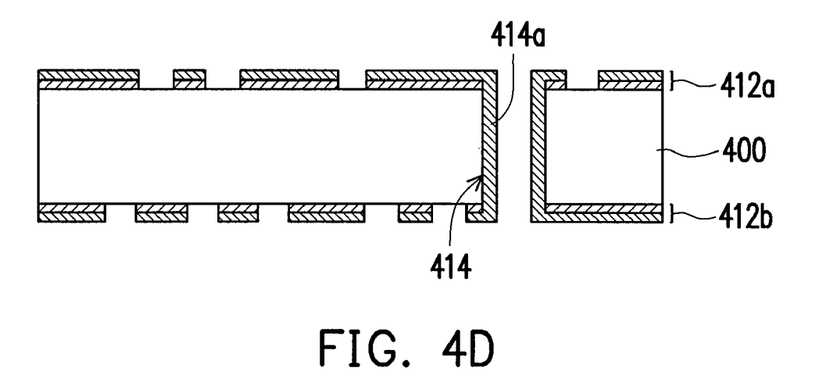

Thereafter, as shown in FIG. 4D, the conductive layers 412a and 412b are patterned through implementing photolithography and etching processes, for example.

Figure 4E:
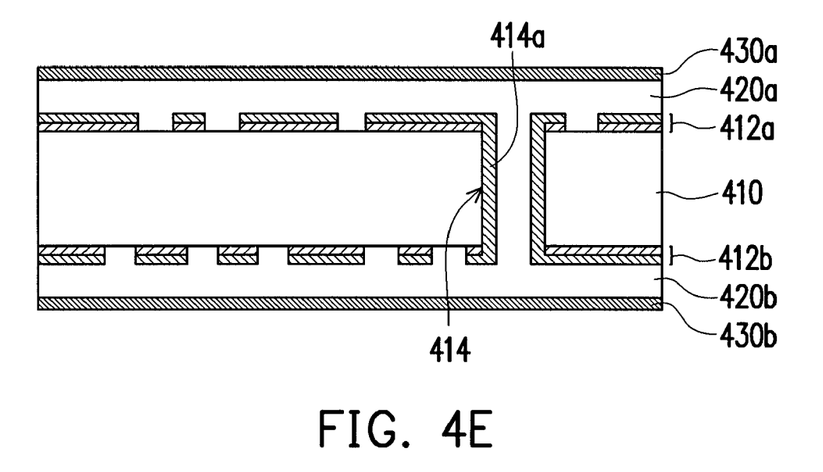

After that, with reference to FIG. 4E, two dielectric layers 420a and 420b are respectively formed on the patterned conductive layers 412a and 412b. Two conductive layers 430a and 430b are then respectively disposed on surfaces of the two dielectric layers 420a and 420b.

Figure 4F:
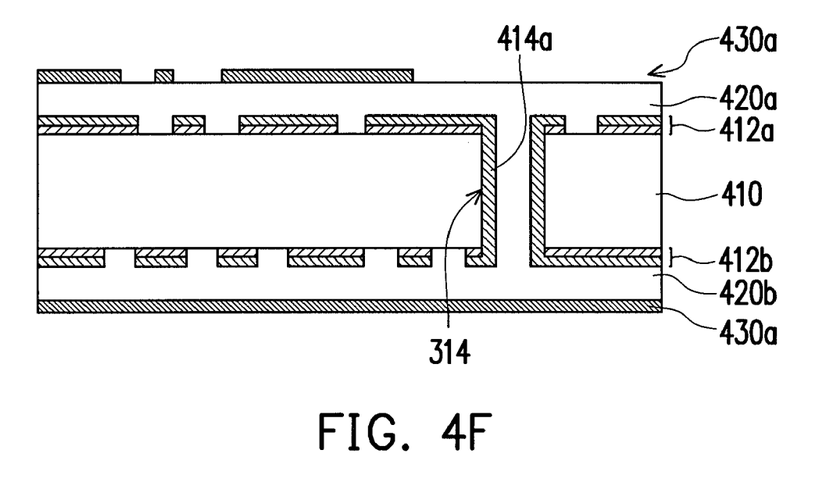

As indicated in FIG. 4F, portions of the conductive layers 430a and 430b are then removed by performing the photolithography and etching processes, for example, such that the dielectric layers 420a and 420b are partially exposed.

Figure 4G:
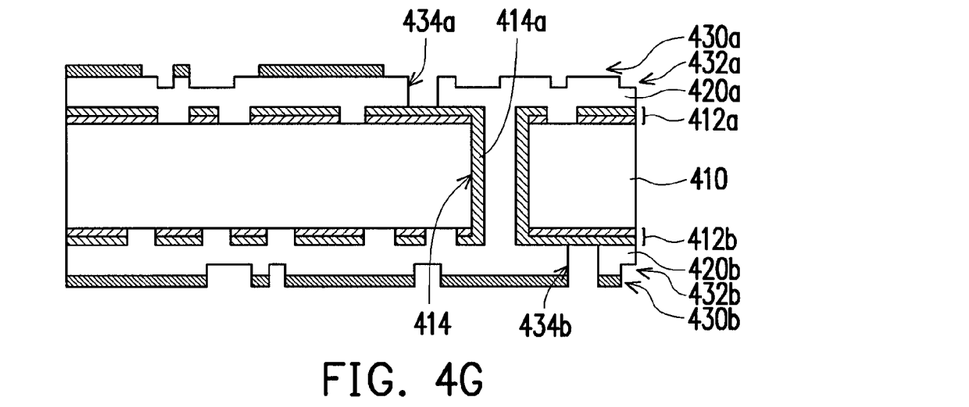

Ultra fine trenches 432a and 432b depicted in FIG. 4G are subsequently laser-ablated on the dielectric layers 420a and 420b. Note that two openings 434a and 434b can be respectively formed on the dielectric layers 420a and 420b by laser ablating when the ultra fine trenches 432a and 432b are simultaneously formed by laser ablating.

Figure 4H:
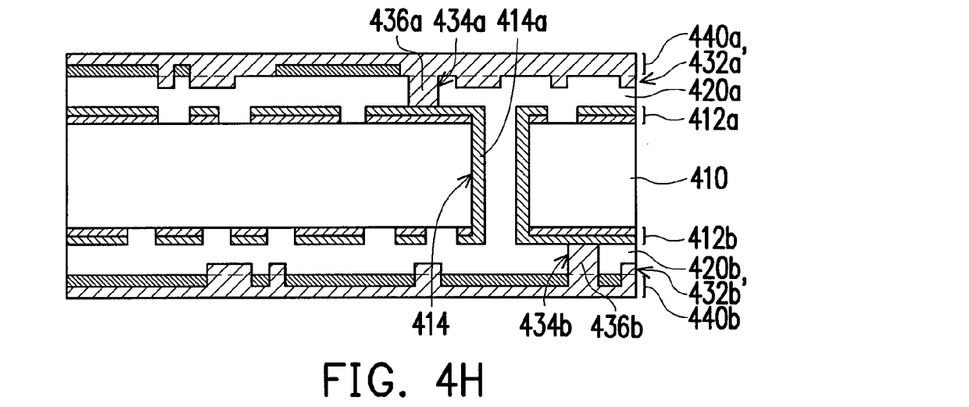

Next, as shown in FIG. 4H, the ultra fine trenches 432a and 432b and the openings 434a and 434b are filled with a conductive material by electroplating, for example, so as to form ultra fine patterns 432a' and 432b' and conductive micro vias 436a and 436b. Meanwhile, two conductive layers are formed on the entire ultra fine patterns 432a' and 432b'. The two conductive layers and the conductive layers 430a and 430b together constitute two non-patterned conductive layers 440a and 440b. Note that the conductive material may include copper.

Figure 4I:
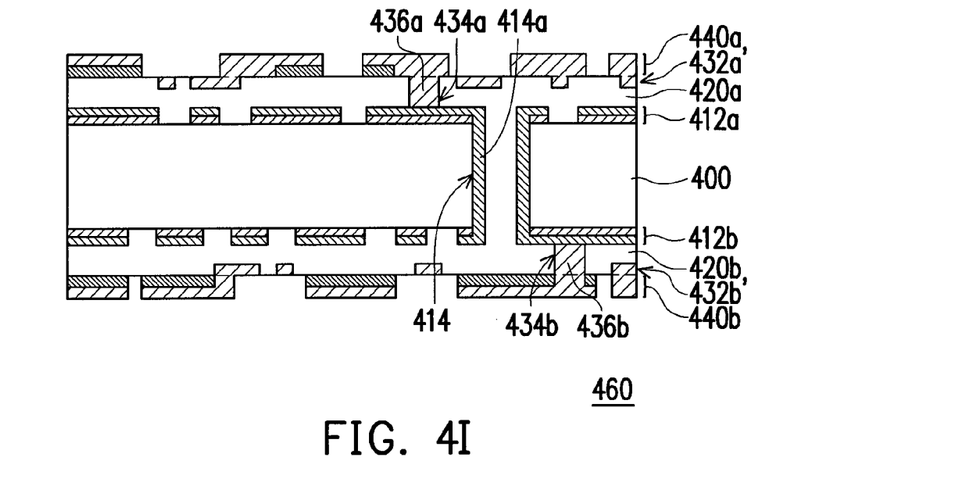

It is shown in FIG. 4I that the non-patterned conductive layers 440a and 440b are then patterned by performing the photolithography and etching processes, for example, and the patterned conductive layers 440a and 440b are partially connected to portions of the ultra fine patterns 432a' and 432b'.

Figure 4J:
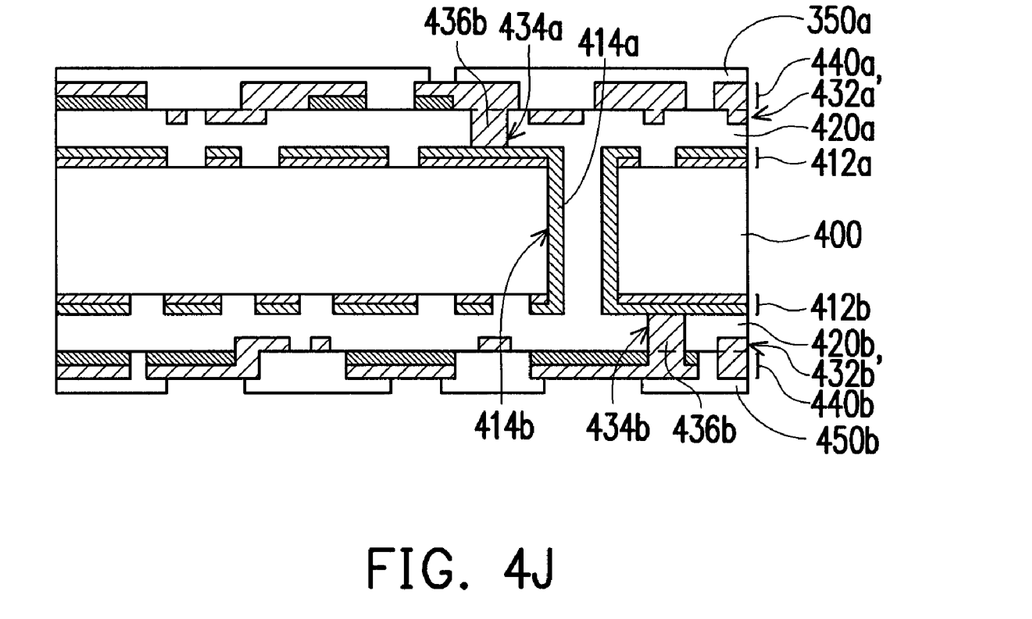

Afterwards, with reference to FIG. 4J, two solder masks 450a and 450b are formed on the patterned conductive layers 440a and 440b, respectively, such that an electrical interconnecting structure 460, i.e. a circuit board structure, is completely formed.

In the third embodiment of the present invention, the circuit board having the four conductive layers and at least one ultra fine pattern inlaid in the surface of the dielectric layer are provided. The line width and the pitch of the ultra fine pattern are smaller than those of a normal patterned conductive layer, and therefore the ultra fine pattern is conducive to an improvement of an average layout density of the circuit board. Additionally, the ultra fine pattern and the patterned conductive layers partially connected to the ultra fine pattern in the present embodiment can be formed by performing not only a subtractive process but also an additive process or a semi-additive process.

It should be mentioned that the openings and the ultra fine trenches are respectively formed on the conductive layers (i.e. the copper foil) and the dielectric layer by laser ablating in the second embodiment. By contrast, according to the third embodiment, after the conductive layers (i.e. the copper foil) are partially removed by performing the photolithography and etching processes, the surface of the dielectric layer on which the ultra fine trenches are to be formed is exposed.

To sum up, the ultra fine pattern is inlaid in the surface of the core (the dielectric layer) and is partially connected to the patterned conductive layer disposed on the surface of the core (the dielectric layer) according to the present invention. The line width and the pitch of the ultra fine pattern are smaller than those of the normal patterned conductive layer, and therefore the ultra fine pattern is conducive to the improvement of the average layout density of the circuit board.

Hence, given that the circuit board is meant to provide an increased number of signal transmission paths, the ultra fine patterns inlaid in the surface of the dielectric layer can be utilized for providing additional signal transmission paths to the circuit board according to the present invention. As such, it is not necessary to increase the number of the patterned conductive layers of the circuit board.

In other words, when the circuit board provides the required signal transmission paths with use of a plurality of patterned conductive layers, the ultra fine patterns inlaid in the surface of the dielectric layer can be used to form the signal transmission paths for replacing other signal transmission paths formed by certain conductive layers of the circuit board. As a result, the number of the required patterned conductive layers in the circuit board can be decreased, and the entire thickness of the circuit board can be further reduced.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. An electrical interconnecting structure, suitable for a circuit board, the electrical interconnecting structure comprising:
   a core, having a surface and a plurality of ultra fine trenches with fine trench patterns respectively in the surface;
   a plurality of ultra fine conductive patterns, filling up the ultra fine trenches so as to inlay the surface of the core, wherein the ultra fine conductive patterns respectively correspond to the fine trench patterns; and
   a patterned conductive layer, disposed on the surface of the core and partially connected to a portion of the ultra fine conductive patterns and exposing a portion of the ultra fine conductive patterns.

2. The electrical interconnecting structure as claimed in claim 1, wherein the core is a dielectric layer.

3. A circuit board structure, comprising:
   a core, having a first surface with a plurality of first ultra fine trenches therein and a second surface corresponding to the first surface, wherein each of the first ultra fine trenches corresponds with a first fine trench pattern;
   a plurality of first ultra fine conductive patterns, filling up the first ultra fine trenches so as to inlay the first surface of the core, wherein the first ultra fine conductive patterns respectively correspond to the first fine trench patterns;
   a first patterned conductive layer, disposed on the first surface of the core and partially connected to a portion of the first ultra fine conductive patterns; and
   a second patterned conductive layer, disposed on the second surface of the core.

4. The circuit board structure as claimed in claim 3, further comprising at least a first conductive through via that penetrates the core and connects the first patterned conductive layer and the second patterned conductive layer.

5. The circuit board structure as claimed in claim 3, wherein the second surface comprises a plurality of second ultra fine trenches therein and the circuit board structure as claimed in claim 4 further comprises a plurality of second ultra fine conductive patterns filling up the second ultra fine trenches so as to inlay the second surface of the core, wherein the first ultra fine conductive patterns are partially connected to a portion of the second patterned conductive layer.

6. The circuit board structure as claimed in claim 3, wherein the core is a dielectric layer.

7. A process for fabricating an electrical interconnecting structure, suitable for a process for fabricating a circuit board, the process for fabricating the electrical interconnecting structure comprising:
providing a core;
removing a portion of the core from a first surface of the core, so as to form a plurality of ultra fine trenches with fine trench patterns respectively in the first surface of the core;
filling the ultra fine trench with a conductive material, so as to form a plurality of ultra fine conductive patterns filling up the ultra fine trenches and inlaying the first surface of the core, wherein the ultra fine conductive patterns respectively correspond to the fine trench patterns; and
patterning a conductive layer on the first surface of the core for forming a patterned conductive layer, wherein the patterned conductive layer is partially connected to a portion of the ultra fine conductive patterns and exposing a portion of the ultra fine conductive patterns.

8. The process for fabricating the electrical interconnecting structure as claimed in claim 7, wherein a method of removing the portion of the core comprises laser ablating.

9. The process for fabricating the electrical interconnecting structure as claimed in claim 7, wherein a conductive layer is simultaneously formed on the first surface of the core during the formation of the ultra fine conductive patterns, and then the patterned conductive layer is formed on the first surface of the core by patterning the conductive layer.

10. The process for fabricating the electrical interconnecting structure as claimed in claim 9, wherein a method of forming the ultra fine conductive patterns and the conductive layer to be patterned comprises electroplating.

11. The process for fabricating the electrical interconnecting structure as claimed in claim 9, wherein a method of patterning the conductive layer comprises performing a subtractive process.

12. The process for fabricating the electrical interconnecting structure as claimed in claim 9, wherein a method of patterning the conductive layer comprises performing photolithography and etching processes.

13. The process for fabricating the electrical interconnecting structure as claimed in claim 7, wherein the patterned conductive layer is simultaneously formed on the first surface of the core during the formation of the ultra fine conductive patterns.

14. The process for fabricating the electrical interconnecting structure as claimed in claim 13, wherein a method of forming the ultra fine conductive patterns and the patterned conductive layer comprises performing an additive process or a semi-additive process.

15. The process for fabricating the electrical interconnecting structure as claimed in claim 7, wherein the core is a dielectric layer.

* * * * *